US012607669B2

(12) United States Patent
Hwang et al.

(10) Patent No.: US 12,607,669 B2
(45) Date of Patent: Apr. 21, 2026

(54) SEMICONDUCTOR CHIP AND SEMICONDUCTOR PACKAGE INCLUDING THE SAME

(71) Applicant: Samsung Electronics Co., Ltd., Suwon-si (KR)

(72) Inventors: Sehyun Hwang, Suwon-si (KR); Jongmin Lee, Suwon-si (KR); Joongwon Shin, Suwon-si (KR); Jimin Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 481 days.

(21) Appl. No.: 18/174,865

(22) Filed: Feb. 27, 2023

(65) Prior Publication Data

US 2024/0069093 A1 Feb. 29, 2024

(30) Foreign Application Priority Data

Aug. 30, 2022 (KR) ........................ 10-2022-0109513

(51) Int. Cl.
*G01R 31/28* (2006.01)
*H01L 23/00* (2006.01)
(Continued)

(52) U.S. Cl.
CPC .......... *G01R 31/2884* (2013.01); *H01L 23/50* (2013.01); *H01L 23/528* (2013.01);
(Continued)

(58) Field of Classification Search
CPC ... G01R 31/2884; H01L 23/50; H01L 23/528; H01L 24/05
See application file for complete search history.

(56) References Cited

U.S. PATENT DOCUMENTS 6,313,537 B1 * 11/2001 Lee ........................ H01L 24/05
257/784
6,492,260 B1 * 12/2002 Kim .................... H01L 21/7684
438/692
(Continued)

FOREIGN PATENT DOCUMENTS

CN 112701100 A * 4/2021 ......... H01L 23/4828
CN 110060969 B * 7/2021 ........... H01L 23/485
(Continued)

OTHER PUBLICATIONS

Extended European Search Report corresponding to EP Application No. 23168746.8; dated Jan. 25, 2024 (9 pages).

*Primary Examiner* — Laura M Menz
(74) *Attorney, Agent, or Firm* — Wolf, Greenfield & Sacks, P.C.

(57) ABSTRACT

Provided are a semiconductor chip with a reduced thickness and improved reliability, and a semiconductor package including the semiconductor chip. The semiconductor chip includes a semiconductor substrate, an integrated device layer on the semiconductor substrate, a multi-wiring layer on the integrated device layer, and a pad metal layer of a plurality of pad metal layers on the multi-wiring layer, and having test pads defined therein. The pad metal layers extend in a first direction parallel to a top surface of the semiconductor substrate or in a second direction perpendicular to the first direction. A test pad is a central portion of the pad metal layer and, and an outer portion of the pad metal layer excluding the test pad overlaps the wires in a third direction perpendicular to the top surface of the semiconductor substrate.

8 Claims, 16 Drawing Sheets

(51) Int. Cl.
    *H01L 23/50*         (2006.01)
    *H01L 23/528*      (2006.01)
    *H10B 80/00*       (2023.01)

(52) U.S. Cl.
    CPC ............. *H01L 24/05* (2013.01); *H10B 80/00* (2023.02); *H01L 24/13* (2013.01); *H01L 24/16* (2013.01); *H01L 24/32* (2013.01); *H01L 24/73* (2013.01); *H01L 2224/0557* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/16145* (2013.01); *H01L 2224/32145* (2013.01); *H01L 2224/73204* (2013.01); *H01L 2924/1431* (2013.01); *H01L 2924/14361* (2013.01)

(56) References Cited

U.S. PATENT DOCUMENTS

| | | | | |
|---|---|---|---|---|
| 7,518,242 B2 * | 4/2009 | Hirai | .................. | H01L 22/32 |
| | | | | 257/E23.02 |
| 7,714,443 B2 * | 5/2010 | Chen | .................. | H01L 24/05 |
| | | | | 257/781 |
| 8,482,002 B2 * | 7/2013 | Mun | .................. | H01L 23/3171 |
| | | | | 257/784 |
| 8,779,593 B2 * | 7/2014 | Ogata | .................. | H01L 24/05 |
| | | | | 257/E23.153 |
| 9,818,701 B2 * | 11/2017 | Yoshizawa | .......... | H01L 23/564 |
| 10,297,494 B2 * | 5/2019 | Yu | .................. | H01L 21/4853 |
| 11,289,438 B2 * | 3/2022 | Hong | .................. | H01L 24/05 |
| 11,658,141 B2 * | 5/2023 | Hong | .................. | H01L 24/32 |
| | | | | 257/621 |
| 2002/0121703 A1 * | 9/2002 | Toyoda | .................. | H01L 24/11 |
| | | | | 257/762 |
| 2004/0150070 A1 * | 8/2004 | Okada | .................. | H01L 23/585 |
| | | | | 257/E23.161 |
| 2005/0116338 A1 * | 6/2005 | Hirai | .................. | H01L 24/05 |
| | | | | 257/734 |
| 2006/0065969 A1 * | 3/2006 | Antol | .................. | H01L 24/48 |
| | | | | 257/786 |
| 2007/0007655 A1 * | 1/2007 | Miyamori | .......... | H01L 23/5226 |
| | | | | 257/E23.145 |
| 2010/0181567 A1 * | 7/2010 | Mun | .................. | H01L 24/05 |
| | | | | 257/E23.012 |
| 2012/0119371 A1 * | 5/2012 | Matsumoto | .......... | H01L 24/03 |
| | | | | 257/E21.59 |
| 2015/0031189 A1 * | 1/2015 | Chen | .................. | H01L 21/68707 |
| | | | | 156/345.31 |
| 2016/0218069 A1 * | 7/2016 | Yoshizawa | .......... | H01L 23/544 |
| 2016/0343673 A1 * | 11/2016 | Ling | .................. | H01L 21/78 |
| 2020/0266114 A1 * | 8/2020 | Park | .................. | H01L 22/32 |
| 2021/0098421 A1 * | 4/2021 | Wu | .................. | H01L 23/3675 |
| 2021/0104482 A1 * | 4/2021 | Hong | .................. | H01L 25/18 |
| 2022/0181285 A1 * | 6/2022 | Hong | .................. | H01L 25/18 |
| 2022/0262769 A1 * | 8/2022 | Oh | .................. | H01L 24/14 |
| 2024/0069093 A1 * | 2/2024 | Hwang | .................. | H01L 23/50 |
| 2024/0103070 A1 * | 3/2024 | Lee | .................. | G01R 31/2856 |
| 2024/0128236 A1 * | 4/2024 | Kim | .................. | H01L 25/18 |
| 2024/0145317 A1 * | 5/2024 | Shin | .................. | H10B 80/00 |
| 2024/0234325 A1 * | 7/2024 | Baek | .................. | H01L 25/105 |
| 2024/0258275 A1 * | 8/2024 | Ahn | .................. | H01L 23/481 |
| 2025/0046659 A1 * | 2/2025 | Lee | .................. | H01L 24/05 |
| 2025/0149480 A1 * | 5/2025 | Lee | .................. | H01L 23/3128 |
| 2025/0201725 A1 * | 6/2025 | Lim | .................. | H01L 23/5388 |
| 2025/0210558 A1 * | 6/2025 | Hori | .................. | H10B 43/40 |

FOREIGN PATENT DOCUMENTS

| | | | | | |
|---|---|---|---|---|---|
| CN | 113257800 A | * | 8/2021 | .......... | H01L 25/105 |
| CN | 113658873 A | * | 11/2021 | ......... | H01L 23/5385 |
| CN | 117637699 A | * | 3/2024 | ............ | H01L 22/32 |
| CN | 112701100 B | * | 9/2025 | ............ | H01L 25/50 |
| EP | 3806145 A1 | * | 4/2021 | ....... | H01L 23/49827 |
| EP | 4287248 A1 | * | 12/2023 | ............ | H01L 24/05 |
| EP | 4333032 A1 | * | 3/2024 | ............ | H01L 22/32 |
| JP | 2024035086 A | * | 3/2024 | ............ | H01L 22/32 |
| KR | 100278662 B1 | | 2/2001 | | |
| KR | 20090094464 A | * | 9/2009 | ............ | H10D 1/682 |
| KR | 20210041363 A | * | 4/2021 | ......... | H01L 23/3135 |
| KR | 20210051535 A | * | 5/2021 | ............ | H01L 25/50 |
| KR | 102318172 B1 | | 10/2021 | | |
| KR | 20240030452 A | * | 3/2024 | ............ | H01L 22/32 |
| KR | 20240111855 A | * | 7/2024 | ......... | H01L 23/562 |
| KR | 102713395 B1 | * | 10/2024 | ............ | H01L 25/50 |
| KR | 102722915 B1 | * | 10/2024 | ............ | H01L 25/18 |
| TW | 202129875 A | | 8/2021 | | |

* cited by examiner

BPA

BPA1

BPA2

A

TPA4(TPA)

B

TPA3(TPA)

TPA1

TPA2

TPA x y

SEMICONDUCTOR CHIP AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2022-0109513, filed on Aug. 30, 2022, in the Korean Intellectual Property Office, the disclosure of which is incorporated by reference herein in its entirety.

BACKGROUND

The inventive concept relates to a semiconductor chip and a semiconductor package, and more particularly, to a semiconductor chip including a test pad and a semiconductor package including the semiconductor chip.

Due to the rapid developments of the electronics industry and demands of users, electronic devices are becoming smaller and lighter. Accordingly, a high degree of integration is needed for semiconductor chips used in electronic devices, and the design rules for components of semiconductor chips are further reduced. Also, a low-k material layer is introduced into a semiconductor chip to reduce parasitic capacitance between wires and to reduce RC delay. In a typical semiconductor package, a semiconductor chip is mounted on a printed circuit board (PCB), and the semiconductor chip is electrically connected to the PCB by using a connection member like a bonding wire or a bump. Recently, a semiconductor package implemented by stacking a plurality of semiconductor chips including through silicon vias (TSVs) on a PCB has been developed. Since semiconductor chips including TSVs are stacked through the TSVs and bumps, bump pads may be included instead of bonding pads, and test pads for testing the semiconductor chips may be included.

SUMMARY

The inventive concept provides a semiconductor chip capable of reducing the thickness of a chip while improving reliability, and a semiconductor package including the semiconductor chip.

In addition, the technical goals to be achieved by the inventive concept are not limited to the technical goals mentioned above, and other technical goals may be clearly understood by one of ordinary skill in the art from the following descriptions.

According to some embodiments of the inventive concept, there is provided a semiconductor chip including a semiconductor substrate, an integrated device layer on the semiconductor substrate and having integrated devices therein, a multi-wiring layer on the integrated device layer and having at least two layers of wires, and a pad metal layer of a plurality of pad metal layers on the multi-wiring layer, electrically connected to the wires, and having test pads therein. The pad metal layers are extend in a first direction parallel to a top surface of the semiconductor substrate or a second direction perpendicular to the first direction, a test pad of the test pads includes a central portion of the pad metal layer and is exposed from a protective layer that overlaps the pad metal layer, and an outer portion of the pad metal layer excluding the test pad overlaps the wires in a third direction perpendicular to the top surface of the semiconductor substrate.

According to some embodiments of the inventive concept, there is provided a semiconductor chip including a semiconductor substrate, an integrated device layer on the semiconductor substrate and having integrated devices in the integrated device layer, a multi-wiring layer on the integrated device layer and having at least two layers of wires, and a pad metal layer that is on the multi-wiring layer, is electrically connected to the wires, and has bump pads and test pads therein. The test pads are in a first direction parallel to a top surface of the semiconductor substrate or a second direction perpendicular to the first direction, a test pad of the test pads includes a central portion of the pad metal layer and is exposed from a protective layer that overlaps the pad metal layer. The wires are stacked in a third direction perpendicular to the top surface of the semiconductor substrate, and do not overlap the test pads.

According to some embodiments of the inventive concept, there is provided a semiconductor package including a first semiconductor chip, and at least one second semiconductor chip stacked on the first semiconductor chip, wherein the at least one second semiconductor chip includes a semiconductor substrate, an integrated device layer on the semiconductor substrate, a multi-wiring layer on the integrated device layer and having at least two layers of wires, and a pad metal layer on the multi-wiring layer, electrically connected to the wires, and has test pads therein, pad metal layers including the pad metal layer and are arranged in a first direction parallel to a top surface of the semiconductor substrate or in a second direction perpendicular to the first direction, a test pad including a central portion of the pad metal layer and exposed from a protective layer that overlpas the pad metal layer, and, in a third direction perpendicular to the top surface of the semiconductor substrate, the wires do not overlap the test pads.

BRIEF DESCRIPTION OF THE DRAWINGS

Embodiments of the inventive concept will be more clearly understood from the following detailed description taken in conjunction with the accompanying drawings in which:

FIGS. 1A to 1D are a plan view, an enlarged view, and cross-sectional views of a semiconductor chip according to some embodiments;

DETAILED DESCRIPTION

Figure 1A:
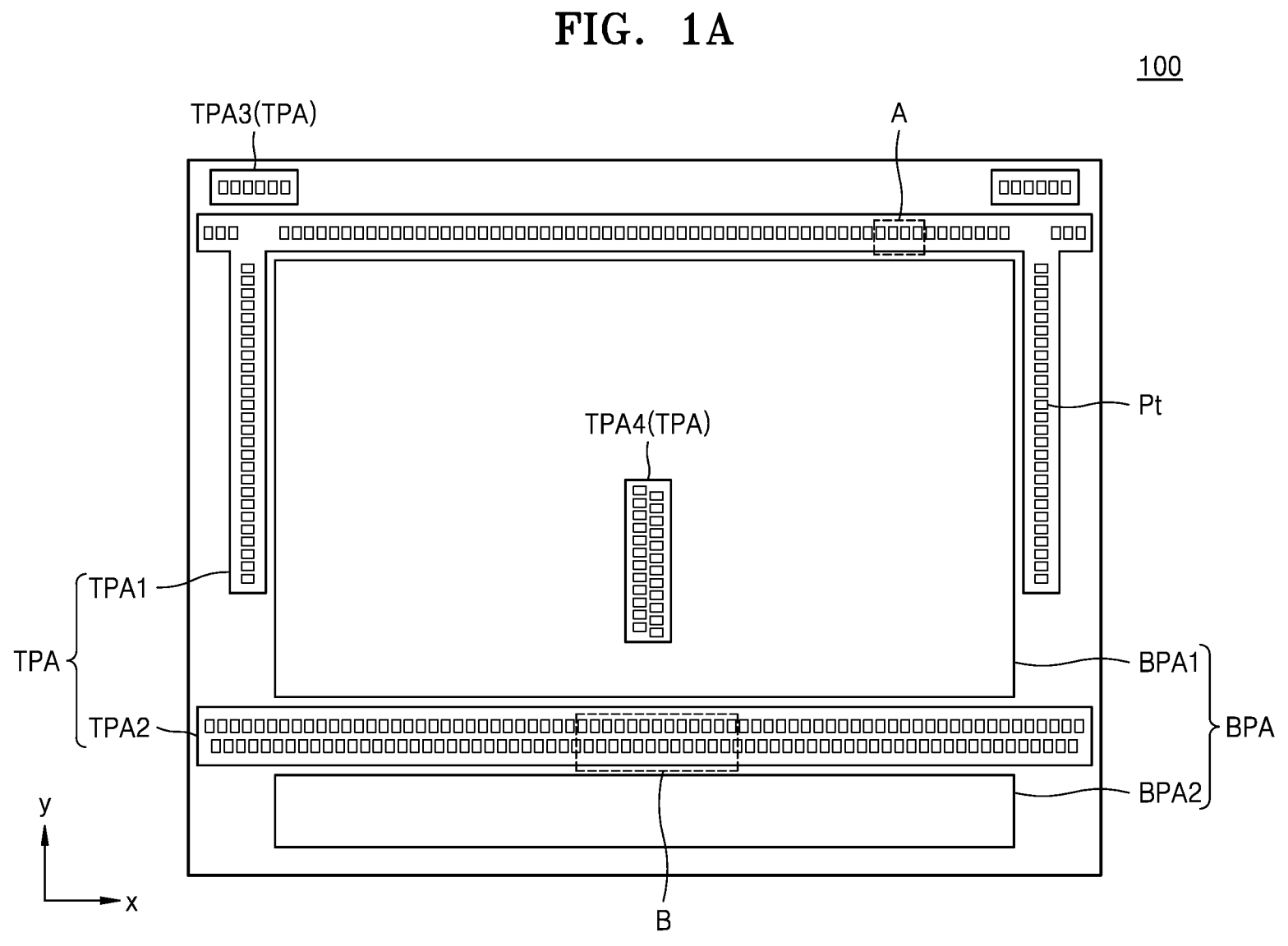
Figure 1B:
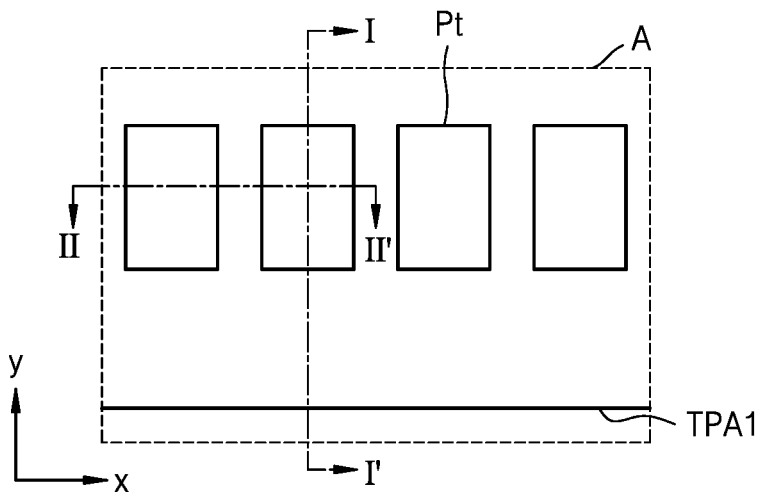
Figure 1C:
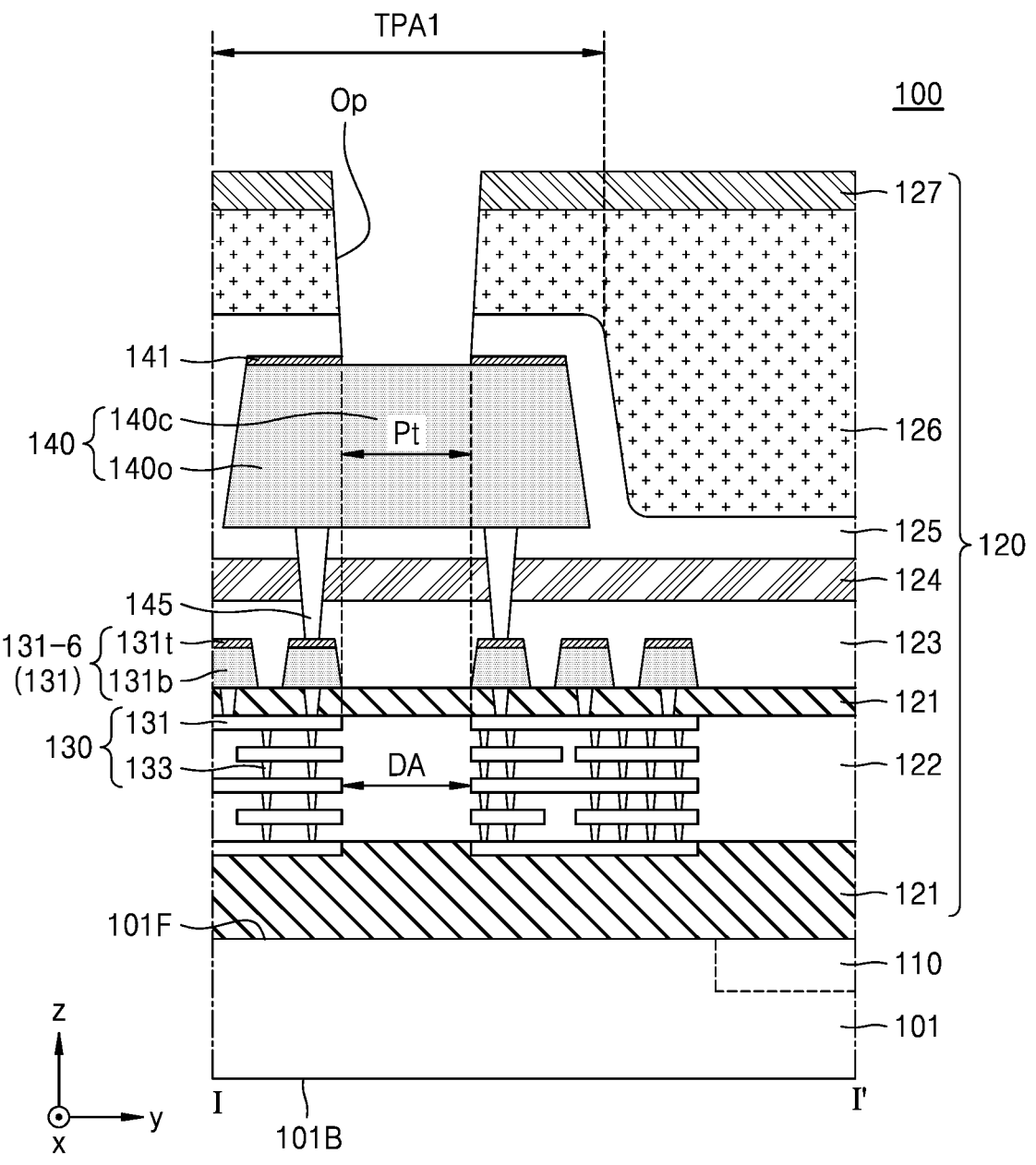
Figure 1D:
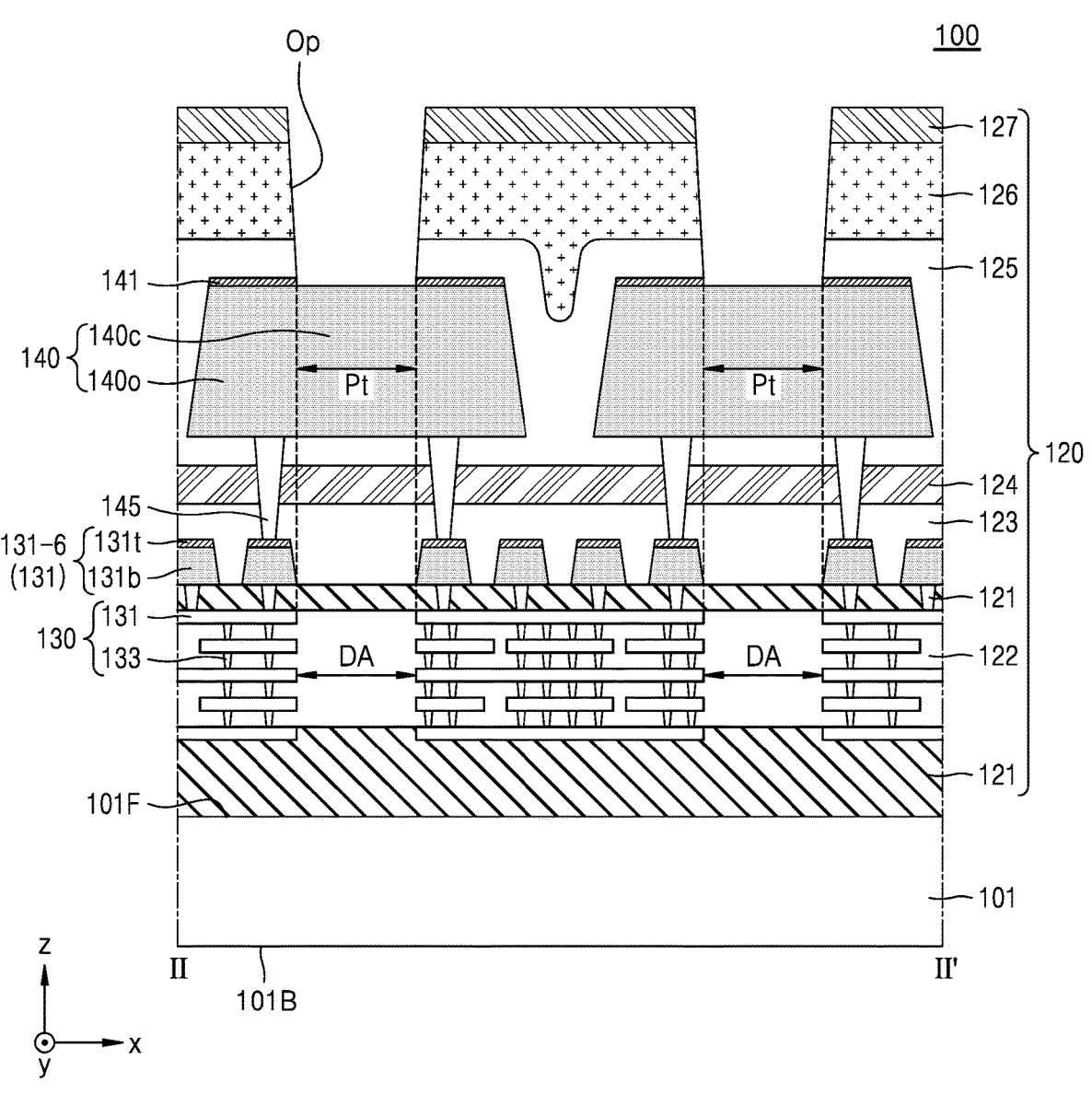

FIGS. 1A to 1D are a plan view, an enlarged view, and cross-sectional views of a semiconductor chip according to some embodiments, wherein FIG. 1B is an enlarged view of a part A of FIG. 1A, FIG. 1C is a cross-sectional view obtained along a line I-I' of FIG. 1B, and FIG. 1D is a cross-sectional view obtained along a line II-II' of FIG. 1B.

Referring to FIGS. 1A to 1D, a semiconductor chip 100 according to some embodiments may include a bump pad area BPA and a test pad area TPA, when viewed from above. Bump pads (refer to 150 of FIG. 8) may be arranged in the bump pad area BPA, and test pads Pt may be arranged in the test pad area TPA. Bump pads 150 refer to pads on which bumps (refer to 170 of FIG. 8) are respectively arranged, and the test pads Pt refer to pads used for testing the semiconductor chip 100, e.g., an electrical die sorting (EDS) test.

As shown in FIG. 1A, the bump pad area BPA may be disposed at the center portion of the semiconductor chip 100, and the test pad area TPA may be disposed at an outer portion of the semiconductor chip 100. In detail, in the semiconductor chip 100 of some embodiments, the bump pad area BPA may include a first bump pad area BPA1 positioned above in a second direction (y direction) and a second bump pad area BPA2 positioned below in the second direction (y direction). Also, the test pad area TPA may include a first test pad area TPA1, which is disposed at an outer portion of the semiconductor chip 100 outside the bump pad area BPA, and a second test pad area TPA2, which is disposed between the first bump pad area BPA1 and the second bump pad area BPA2. Also, the test pad area TPA may further include third test pad areas TPA3, which are arranged at corners of the semiconductor chip 100, and a fourth test pad area TPA4, which is disposed in the first bump pad area BPA1.

In the semiconductor chip 100 of some embodiments, the arrangement structure of the bump pad area BPA and the test pad area TPA is not limited to the arrangement structure shown in FIG. 1A. For example, the arrangement structure of the bump pad area BPA and the test pad area TPA may be variously changed depending on the types of integrated devices arranged therein and the wiring structure of a wiring layer. Here, the surface shown in the plan view of FIG. 1A may correspond to an active surface of the semiconductor chip 100. Therefore, when the semiconductor chip 100 is stacked on a PCB, a buffer chip (refer to 100B of FIG. 8), or another semiconductor chip 100 to form a semiconductor package, the active surface of the semiconductor chip 100 may face downward.

The semiconductor chip 100 of some embodiments may include a semiconductor substrate 101, an integrated device layer 110, an interlayer insulation layer 120, a multi-wiring layer 130, and a pad metal layer 140, when viewed from above. The semiconductor substrate 101 may include, for example, silicon (Si). However, the material constituting the semiconductor substrate 101 is not limited to Si. For example, the semiconductor substrate 101 may include another semiconductor element like germanium (Ge) or may include a compound semiconductor like SiC, GaAs, InAs, InP, etc. Meanwhile, the semiconductor substrate 101 may have a silicon-on-insulator (SOI) structure. For example, the semiconductor substrate 101 may include a buried oxide (BOX) layer. The semiconductor substrate 101 may include a conductive region, for example, a well doped with impurities or a structure doped with impurities. Also, the semiconductor substrate 101 may include various device isolation structures, e.g., a shallow trench isolation (STI) structure.

The semiconductor substrate 101 has an active surface 101F and an inactive surface 101B opposite thereto, and the integrated device layer 110 in which a plurality of integrated devices are formed may be disposed on the active surface 101F of the semiconductor substrate 101. Here, in the cross-sectional views of FIGS. 1C and 4B to 7, to emphasize portions of the multi-wiring layer 130 and the pad metal layer 140, a portion of the semiconductor substrate 101 including the integrated device layer 110 is shown with a relatively small thickness. However, as shown in FIG. 8, in reality, the portion of the semiconductor substrate 101 including the integrated device layer 110 may have a thickness greater than those of the portions of the interlayer insulation layer 120 and the multi-wiring layer 130.

The integrated devices of the integrated device layer 110 may include memory devices or logic devices. The memory devices may include, for example, dynamic random access memory (DRAM) devices, static random access memory (SRAM) devices, flash memory devices, electrically erasable and programmable read-only memory (EEPROM) devices, phase-change random access memory (PRAM) devices, magnetic random access memory (MRAM) devices, or resistive random access memory (RRAM) devices. The logic devices may include, for example, AND devices, NAND devices, OR devices, NOR devices, exclusive OR (XOR) devices, exclusive NOR (XNOR) devices, inverter (INV) devices, adder (ADD) devices, buffer (BUF) devices, delay (DLY) devices, filter (FIL) devices, multiplexer (MXT/MXIT) devices, OR/AND/INVERTER (OAI) devices, AND/OR (AO) devices, AND/OR/INVERTER (AOI) devices, D flip-flop devices, reset flip-flop devices, master-slaver flip-flop devices, latch devices, or counters. Also, the logic devices may include, for example, a central processing unit (CPU), a microprocessing unit (MPU), a graphics processing unit (GPU), or an application processor (AP).

In the semiconductor chip 100 of some embodiments, the integrated device layer 110 may include memory devices, e.g., DRAM devices. In other words, the semiconductor chip 100 of some embodiments may be a DRAM chip. Also, the semiconductor chip 100 of some embodiments may be a high bandwidth memory (HBM) DRAM chip and may be used in an HBM package. The structure of an HBM package is described in more detail below with reference to FIG. 8.

The interlayer insulation layer 120 may be disposed on the semiconductor substrate 101. The interlayer insulation layer 120 may include first to seventh interlayer insulation layers 121 to 127. However, the number of layers of the interlayer insulation layer 120 is not limited to seven. For example, according to some embodiments, the interlayer insulation layer 120 may include 6 or less layers, or 8 or more layers. Meanwhile, the sixth interlayer insulation layer 126 and the seventh interlayer insulation layer 127 of the interlayer insulation layer 120 protect wiring layers and integrated devices therebelow, and thus, the sixth interlayer insulation layer 126 and seventh interlayer insulation layer 127 may be referred to as protective layers. Also, since the sixth interlayer insulation layer 126 has a planarization during a manufacturing process as well function as a protective layer, the sixth interlayer insulation layer 126 may also be referred to as a planarization layer.

The first interlayer insulation layer 121 and the fifth interlayer insulation layer 125 may include tetraethyl orthosilicate (TEOS). However, the material constituting the first interlayer insulation layer 121 and the fifth interlayer insulation layer 125 is not limited to TEOS. For example, the first interlayer insulation layer 121 and the fifth interlayer insulation layer 125 may include phosphor silicate glass (PSG), boro-phosphor silicate glass (BPSG), undoped silicate glass (USG), plasma enhanced-TEOS (PE-TEOS), a high-density plasma-chemical vapor deposition (HDP-CVD) oxide layer, etc.

The second interlayer insulation layer 122 may include a low-k material. The second interlayer insulation layer 122 may be disposed in the first interlayer insulation layer 121. The second interlayer insulation layer 122 including a low-k material may reduce parasitic capacitance and improve RC delay. For example, the second interlayer insulation layer 122 may include an insulating material having a lower dielectric constant than that of silicon oxide ($SiO_2$). According to some embodiments, the second interlayer insulation layer 122 may include a material having an ultra-low dielectric constant k from about 2.2 to about 2.4. The second interlayer insulation layer 122 may include a silicon oxide layer including carbon (C) or hydrocarbon ($C_xH_y$). For example, the second interlayer insulation layer 122 may include a SiOC layer or a SiCOH layer.

The third interlayer insulation layer 123 and the sixth interlayer insulation layer 126 may include an HDP-CVD oxide film. However, the material constituting the third interlayer insulation layer 123 and the sixth interlayer insulation layer 126 is not limited to the HDP-CVD oxide film. For example, the third interlayer insulation layer 123 and the sixth interlayer insulation layer 126 may include various oxide films stated above for the first interlayer insulation layer 121 and the fifth interlayer insulation layer 125.

The fourth interlayer insulation layer 124 and the seventh interlayer insulation layer 127 may include silicon nitride like $SiN_x$. However, the material constituting the fourth interlayer insulation layer 124 and the seventh interlayer insulation layer 127 is not limited to silicon nitride.

The multi-wiring layer 130 may include multi-layered wires 131 and via contacts 133 interconnecting the wires 131 adjacent to one another in a third direction (z direction). The via contacts 133 may also connect integrated devices on the semiconductor substrate 101 and the wires 131 to each other. In the semiconductor chip 100 of some embodiments, the multi-wiring layer 130 may include six layers of wires 131. However, the number of layers of the wires 131 of the multi-wiring layer 130 is not limited to six. For example, according to some embodiments, the number of layers of the wires 131 of the multi-wiring layer 130 may be 5 or less or 7 or more. According to some embodiments, the pad metal layer 140 may be included in the multi-wiring layer 130. However, in the semiconductor chip 100 of some embodiments, to emphasize the role and the characteristics of the test pads Pt, the pad metal layer 140 is described as a separate layer from the multi-wiring layer 130.

The wires 131 and the via contacts 133 of the multi-wiring layer 130 may include a metal like aluminum (Al), copper (Cu), or tungsten (W). According to some embodiments, the wires 131 and the via contacts 133 may include a barrier layer and a wiring metal layer. The barrier layer may include a metal like Ti, Ta, Al, Ru, Mn, Co, or W, a nitride of the metal, an oxide of the metal, or an alloy like cobalt tungsten phosphide (CoWP), cobalt tungsten boron (CoWB), or cobalt tungsten boron phosphide (CoWBP). Also, the wiring metal layer may include at least one metal selected from among W, Al, Ti, Ta, Ru, Mn, and Cu.

In the semiconductor chip 100 of some embodiments, the wires 131 of first to fifth layers of the multi-wiring layer 130 may include Cu. A wire 131-6 of the uppermost sixth layer may include Al. Also, the wire 131-6 of the sixth layer may include a body 131b including Al and a top layer 131t including Ti/TiN on the top surface of the body 131b. However, materials constituting the wires 131 of the first to fifth layers and the wire 131-6 of the sixth layer are not limited to the materials stated above. As shown in FIGS. 1C and 1D, the wires 131 of the first to fifth layers may be arranged in the second interlayer insulation layer 122 including a low-k material. Also, the wire 131-6 of the sixth layer may be disposed in the third interlayer insulation layer 123.

The pad metal layer 140 may include the test pads Pt. For example, the pad metal layer 140 may be divided into a central portion 140c and an outer portion 140o when viewed from above. The central portion 140c of the pad metal layer 140 refers to a region exposed from a protective layer, e.g., the sixth interlayer insulation layer 126 and the seventh interlayer insulation layer 127, and may correspond to the test pads Pt. Therefore, open areas Op exposing the test pads Pt may be formed in the sixth interlayer insulation layer 126 and the seventh interlayer insulation layer 127. Meanwhile, the outer portion 140o of the pad metal layer 140 may refer to a region covered or overlapped by the sixth interlayer insulation layer 126 and the seventh interlayer insulation layer 127. Detailed structures of the pad metal layer 140 and the test pads Pt are described in more detail below with reference to FIGS. 3A and 3B.

For reference, the bump pads (refer to 150 of FIG. 8) arranged in the bump pad area BPA may have a shape similar to that of the test pads Pt. For example, exposed portions of a bump metal layer (not shown) in the bump pad area BPA may correspond to the bump pads 150. The bump metal layer may have substantially the same structure as the pad metal layer 140. However, according to embodiments, the bump metal layer may have a structure that is different from that of the pad metal layer 140. Through silicon vias (TSVs) (refer to 160 of FIG. 8) penetrating through the semiconductor substrate 101 may be arranged in a portion of the bump pad area BPA. The TSVs 160 may be respectively connected to the bump pads 150 through the multi-wiring layer 130.

The pad metal layer 140 may include Cu. However, the material constituting the pad metal layer 140 is not limited to Cu. A barrier layer 141 may be disposed on the top surface of the pad metal layer 140. The barrier layer 141 may include, for example, a metal like Ti, Ta, Al, Ru, Mn, Co, or W, a nitride of the metal, or an oxide of the metal. As shown in FIGS. 1C and 1D, the barrier layer 141 may be disposed only on the outer portion 140o of the pad metal layer 140 and may not be disposed on the central portion 140c of the pad metal layer 140, that is, the portion corresponding to the test pads Pt.

Meanwhile, the pad metal layer 140 may be connected to the uppermost wire of the multi-wiring layer 130, e.g., the wire 131-6 of the sixth layer, through top via contacts 145. The top via contacts 145 may include W. However, the material constituting the top via contacts 145 is not limited to W. The top via contacts 145 may be arranged below the outer portion 140o of the pad metal layer 140 and may thus be connected to the pad metal layer 140. As shown in FIGS. 1C and 1D, a plurality of top via contacts 145 may be arranged for one pad metal layer 140. For example, the plurality of top via contacts 145 may be arranged to surround the test pads Pt when viewed from above. The arrangement structure of the top via contacts 145 is described in more detail below with reference to FIGS. 3A and 3B.

In the semiconductor chip 100 of some embodiments, the wires 131 of the multi-wiring layer 130 overlapping the central portion 140c of the pad metal layer 140, i.e., the test pads Pt, in the third direction (z direction) may be omitted. In other words, when an area of the multi-wiring layer 130 overlapping the test pads Pt in the third direction (z direction) is referred to as an isolation region DA, the wires 131 may not be arranged in the isolation region DA. The width of the isolation region DA may correspond to the width of a test pad Pt in each of the first direction (x direction) and the second direction (y direction), respectively, as shown in FIGS. 1C and 1D. Also, according to some embodiments, the width of the isolation region DA may be greater than the width of the test pad Pt in at least one of the first direction (x direction) and the second direction (y direction).

In the semiconductor chip 100 of some embodiments, since the wires 131 of the multi-wiring layer 130 are not arranged overlapping the test pads Pt of the pad metal layer 140, defects of cracks occurring in the wires 131 during a semiconductor chip testing may be prevented, and thus, the reliability of the semiconductor chip 100 may be improved. Also, since the problem of cracks in the wires 131 is resolved, the pad metal layer 140 does not need to have a large thickness, and thus, the thickness of the pad metal layer 140, i.e., the thickness of the test pads Pt, may be sufficiently reduced. As a result, the thickness of the semiconductor chip 100 may be reduced, and the total thickness of a semiconductor package including a plurality of semiconductor chips 100 may be significantly reduced.

Figure 2:
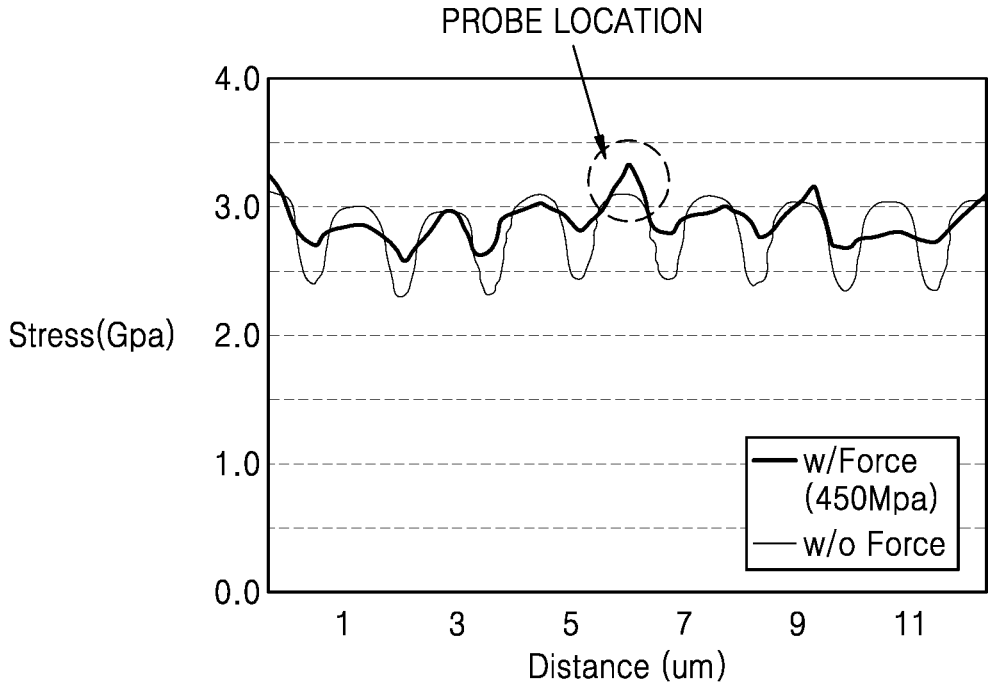
FIG. 2 is a graph showing stress applied to wires of a wiring layer during a test of a semiconductor chip.

FIG. 2 is a graph showing the stress applied to wires of a wiring layer during testing of a semiconductor chip, wherein the thick solid line indicates a state in which a force is applied and the thin solid line indicates a state in which no force is applied. The x-axis represents positions of a probe, and the y-axis represents the stress applied to wires of the uppermost layer of a multi-wiring layer.

Referring to FIG. 2, as it may be seen from the graph, when a force is applied to a probe, the stress is greatest at the position of the probe, that is, at the center of the test pad Pt. Therefore, cracks may occur in the wires 131 under the test pad Pt corresponding to the position of the probe. However, in the semiconductor chip 100 of some embodiments, as described above, the wires 131 may be omitted under the test pads Pt. Therefore, the problem of cracks of the wires 131 may be fundamentally prevented. The state in which a force is applied to the probe may refer to a state in which the probe is pressing the test pad Pt, and the state in which no force is applied to the probe may refer to a state in which the probe is contacting the test pad Pt without pressing the test pad Pt.

Figure 3A:
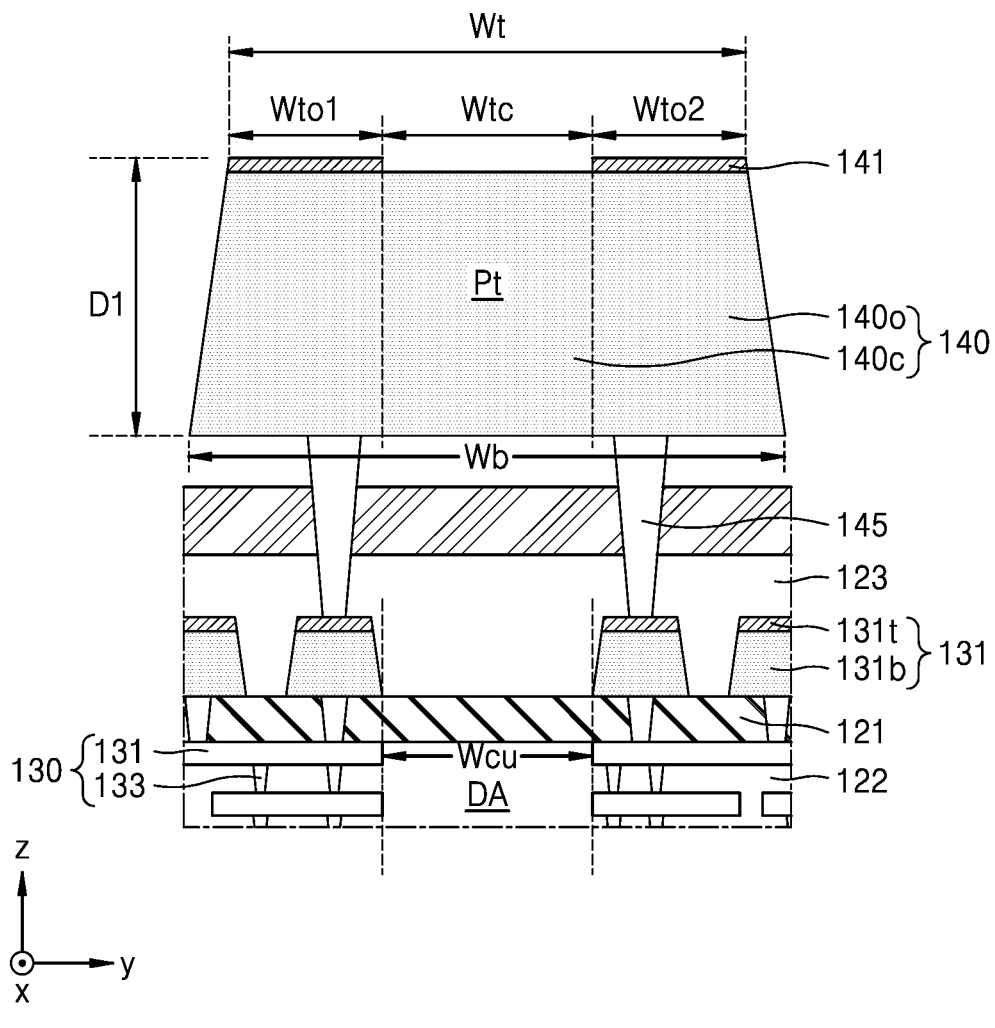
FIGS. 3A and 3B are respectively a cross-sectional view and a perspective view showing portions of a pad metal layer and top via contacts in the semiconductor chip of FIG. 1C in more detail.
Figure 3B:
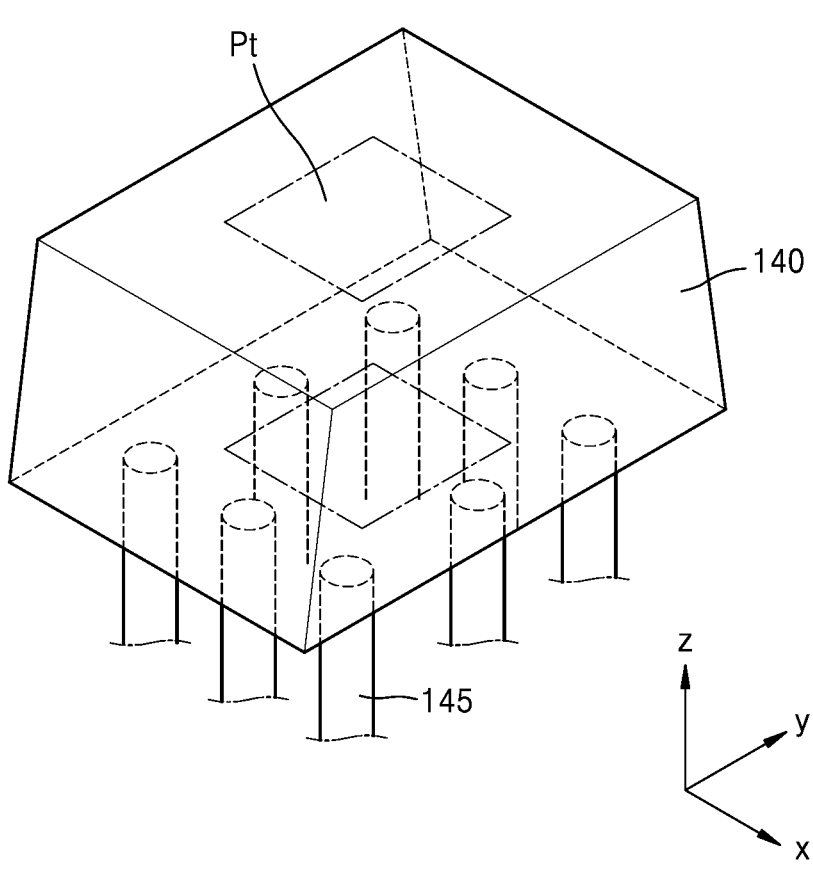

FIGS. 3A and 3B are respectively a cross-sectional view and a perspective view showing portions of a pad metal layer and top via contacts in the semiconductor chip of FIG. 1C in more detail. Descriptions of FIGS. 3A and 3B are given below with reference to FIGS. 1C and 1D, and descriptions already given above with reference to FIGS. 1A to 1D are briefly given or omitted.

Referring to FIGS. 3A and 3B, in the semiconductor chip 100 of some embodiments, the pad metal layer 140 may have an upper width Wt and a lower width Wb that are different from each other in the second direction (y direction). For example, the lower width Wb may be greater than the upper width Wt in the second direction (y direction). According to some embodiments, the pad metal layer 140 may have a structure in which the lower width Wb is substantially the same as the upper width Wt in the second direction (y direction).

Meanwhile, in the pad metal layer 140, a width Wtc of the central portion 140c corresponding to the width of the test pad Pt in the second direction (y direction) may be greater than $\frac{1}{3}$ of the upper width Wt. For example, widths Wto1 and Wto2 of both outer portions 140o of the pad metal layer 140 in the second direction (y direction) may each be less than the width Wtc of the central portion 140c. Also, the pad metal layer 140 may have a first thickness D1, which is substantially uniform in the third direction (z direction), in the second direction (y direction). The first thickness D1 may be, for example, 2 μm or greater. However, the first thickness D1 is not limited thereto.

Meanwhile, in the multi-wiring layer 130, a width Wcu of the isolation region DA in the second direction (y direction) may be substantially equal to or greater than the width Wtc of the central portion 140c. In other words, in the second direction (y direction), the test pads Pt and the wires 131 of the multi-wiring layer 130 may not overlap in the third direction (z direction).

Although descriptions have been given above with the second direction (y direction), as it may be seen in FIG. 3B, a similar relationship may be established between the width of the pad metal layer 140 and the width of the isolation region DA of the multi-wiring layer 130 in the first direction (x direction). Also, the pad metal layer 140 may have the first thickness D1, which is substantially uniform in the third direction (z direction), in the first direction (x direction).

As it may be seen in FIG. 3B, the area of the top surface of the pad metal layer 140 may be less than the area of the bottom surface of the pad metal layer 140. However, a portion defined in the pad metal layer 140 in correspondence to the test pad Pt may have the same area on the top surface and the bottom surface of the pad metal layer 140. When viewed from above, the test pad Pt of the central portion of the pad metal layer 140 may have a rectangular shape, and the outer portion of the pad metal layer 140 surrounding the test pads Pt may have a rectangular ring-like shape.

Meanwhile, the plurality of top via contacts 145 may be arranged under the outer portion of the pad metal layer 140 and may thus be connected to the pad metal layer 140. Also, since the top via contacts 145 are arranged at the outer portion of the pad metal layer 140, the top via contacts 145 may be arranged to surround the test pads Pt when viewed from above. Although FIG. 3B shows that eight top via contacts 145 are connected to one pad metal layer 140, the number of top via contacts 145 connected to one pad metal layer 140 is not limited thereto.

Although the planar structure of the test pads Pt having a rectangular shape has been described above, the planar structure of the test pads Pt is not limited to rectangular shapes. For example, according to some embodiments, the planar structure of the test pads Pt may have a circular shape, an elliptical shape, or a polygonal shape other than rectangular shapes.

Figure 4A:
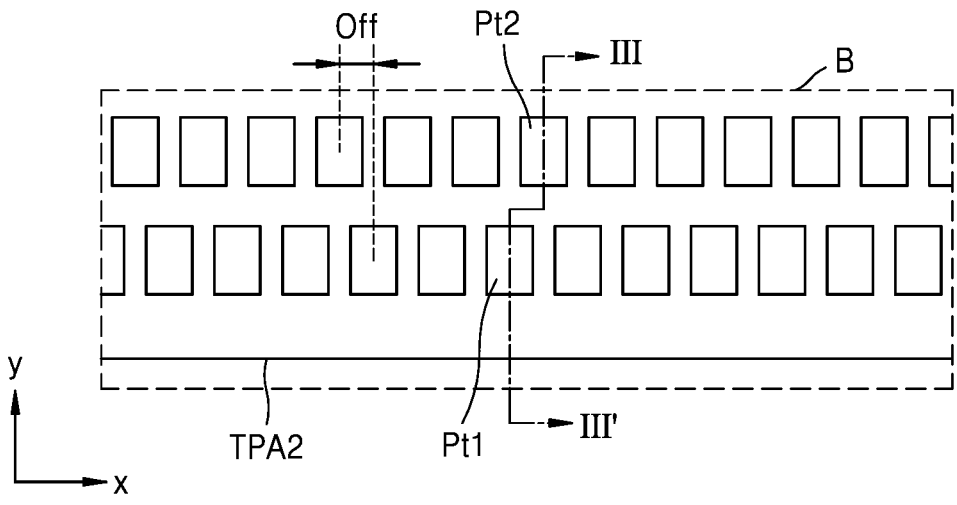
FIGS. 4A and 4B are respectively an enlarged view and a cross-sectional view of a portion B of the semiconductor chip of FIG. 1A.
Figure 4B:
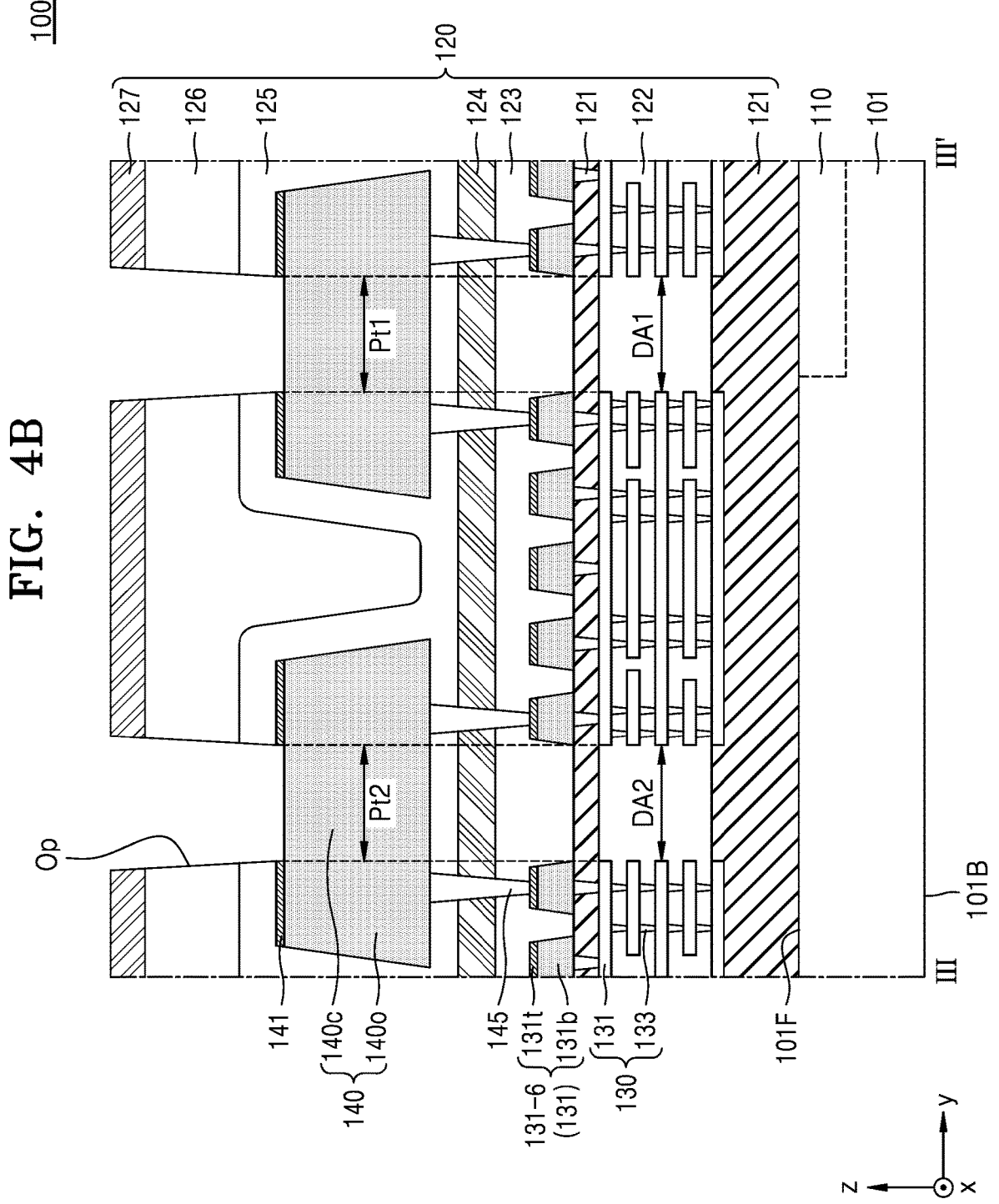

FIGS. 4A and 4B are an enlarged view and a cross-sectional view of a portion B of the semiconductor chip of FIG. 1A, and FIG. 4B is a cross-sectional view taken along a line III-III' of FIG. 4A. Descriptions of FIGS. 4A and 4B are given below with reference to FIG. 1A, and descriptions already given above with reference to FIGS. 1A to 3B are briefly given or omitted.

Referring to FIGS. 4A and 4B, in the semiconductor chip 100 according to some embodiments, the test pads Pt may be arranged in one row in the first test pad area TPA1 in the first direction (x direction) or the second direction (y direction). However, according to some embodiments, in the first test pad area TPA1, the test pads Pt may be arranged in two or more rows in the first direction (x direction) or the second direction (y direction).

The test pads Pt may be arranged in two rows in the first direction (x direction) in the second test pad area TPA2. Also, in the second test pad area TPA2, the test pads Pt may be arranged such that test pads Pt1 in a first row and test pads Pt2 in a second row are offset from each other in the second direction (y direction). In other words, the test pads Pt1 in the first row and the test pads Pt2 in the second row corresponding to the test pads Pt1 in the first row may be offset in the first direction (x direction).

However, in the second test pad area TPA2, the structure of the test pads Pt is not limited to the structure stated above. For example, according to some embodiments, in the second test pad area TPA2, the test pads Pt may be arranged in one row or three or more rows in the first direction (x direction). Also, according to some embodiments, in the second test pad area TPA2, the test pads Pt1 in the first row and the test pads Pt2 in the second row may be arranged to be aligned with each other in the second direction (y direction).

Meanwhile, in the semiconductor chip 100 of some embodiments, as shown in FIG. 4A, when the test pads Pt1 and the test pads Pt2 are each arranged in two rows in the first direction (x direction) or the second direction (y direction), as shown in FIG. 4B, the wires 131 may be arranged in portions of the multi-wiring layer 130 between the test pads Pt1 in the first row and the test pads Pt2 in the second row. Also, the via contacts 133 may be arranged. In other words, the wires 131 may not be arranged only in isolation regions DA1 and DA2 of the multi-wiring layer 130 overlapping the test pads Pt1 and the test pads Pt2 of the pad metal layer 140.

Here, although the cross-sectional view of FIG. 4B is similar to the cross-sectional view of FIG. 1D, pad metal layers 140 are repeatedly arranged in the first direction (x direction) in the cross-sectional view of FIG. 2D, whereas only two pad metal layers 140 are arranged in the second direction (y direction) in the cross-sectional view of FIG. 4B. Also, the distance between the pad metal layers 140 adjacent to each other in the first direction (x direction) in the cross-sectional view of FIG. 1D may be less than the distance between the pad metal layers 140 adjacent to each other in the second direction (y direction) in the cross-sectional view of FIG. 4B. Therefore, the structure of the sixth interlayer insulation layer 126 of FIG. 4B may be slightly different from that of FIG. 1D.

Figure 5A:
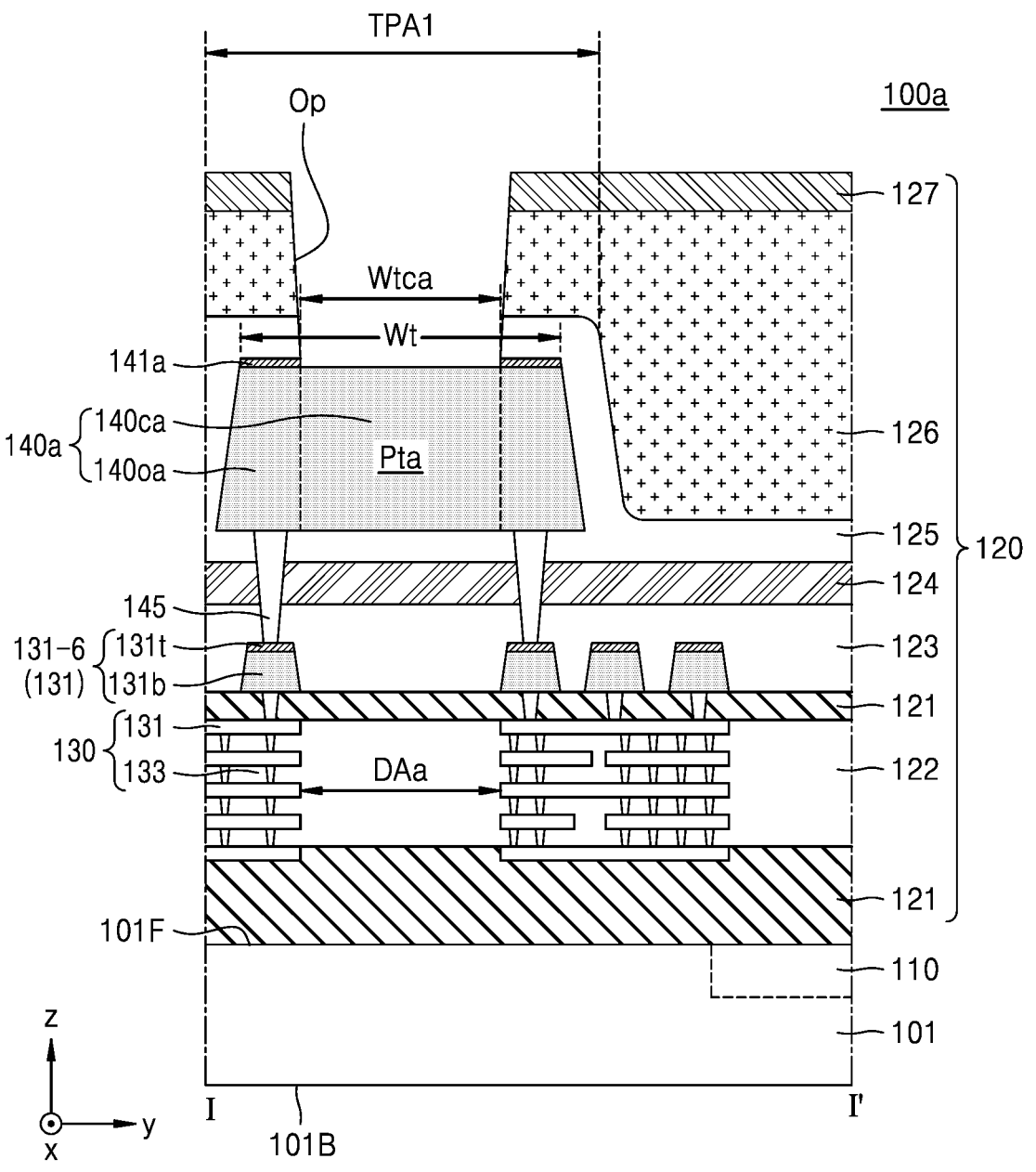
FIGS. 5A and 5B are cross-sectional views of a semiconductor chip according to some embodiments.
Figure 5B:
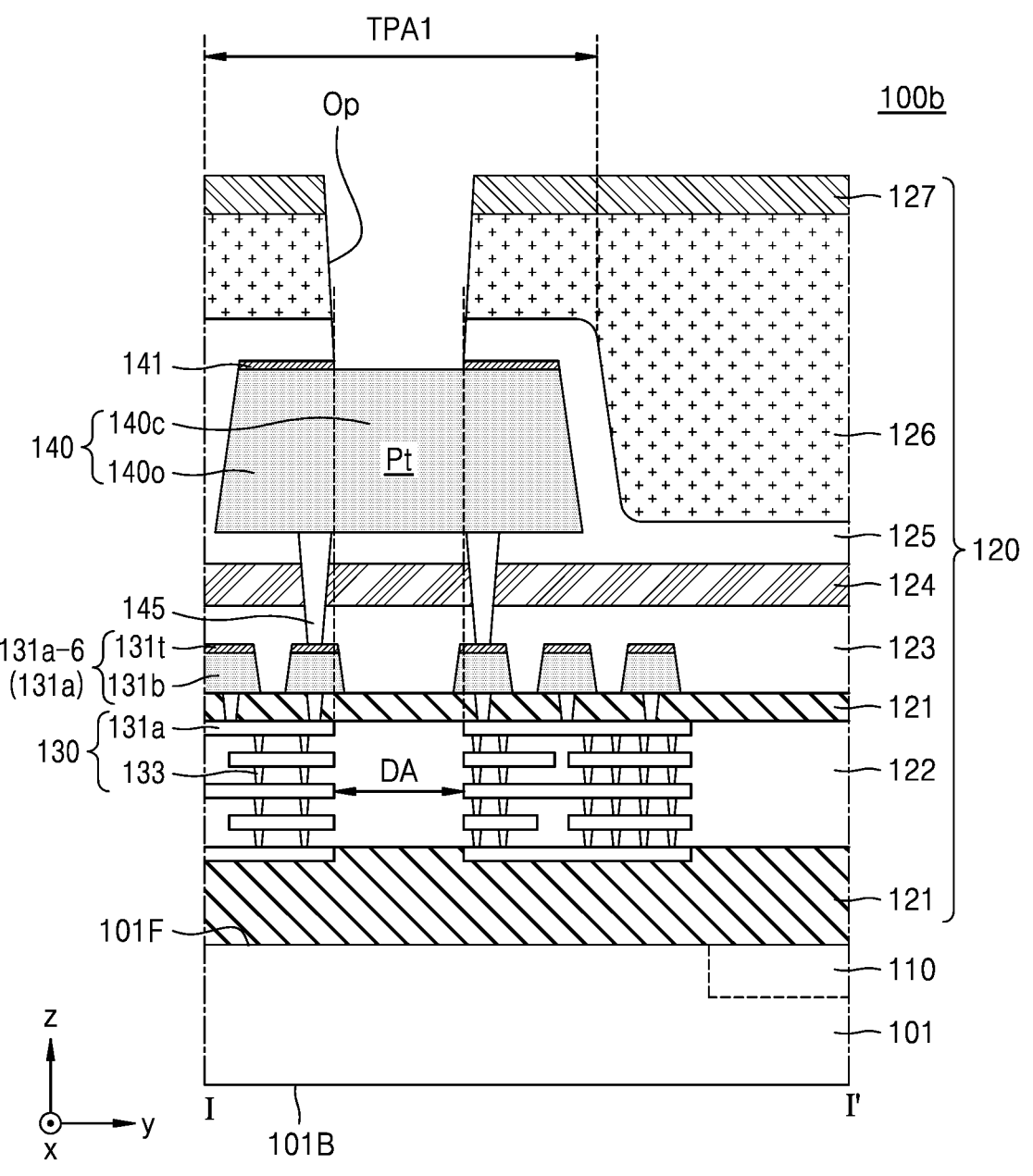

FIGS. 5A and 5B are cross-sectional views of a semiconductor chip according to some embodiments, which may correspond to the cross-sectional view of FIG. 1C. Descriptions already given above with reference to FIGS. 1A to 4B are briefly given or omitted.

Referring to FIG. 5A, a semiconductor chip 100a of some embodiments may be different from the semiconductor chip 100 of FIG. 1C in the structure of a test pad Pta. In detail, in the semiconductor chip 100a of some embodiments, a width Wtca of a central portion 140ca corresponding to the test pad Pta of a pad metal layer 140a in the second direction (y direction) may be half an upper width Wt of the pad metal layer 140a or greater. As the width of the test pad Pta increases in the second direction (y direction), the width of an isolation region DAa of the multi-wiring layer 130 may also increase in the second direction (y direction). Even in the semiconductor chip 100a of some embodiments, the wires 131 may not be arranged in the isolation region DAa of the multi-wiring layer 130 overlapping the test pads Pta in the third direction (z direction).

Referring to FIG. 5B, a semiconductor chip 100b of some embodiments may be different from the semiconductor chip 100 of FIG. 1C in the arrangement structure of wires 131a-6 of a sixth layer. In detail, in the semiconductor chip 100b of some embodiments, at least some of the wires 131a-6 of the sixth layer may overlap the central portion 140c of the pad metal layer 140a, that is, the test pads Pt in the third direction (z direction). As shown in FIG. 5B, the uppermost wires of the multi-wiring layer 130, e.g., the wires 131a-6 of the sixth layer, are thicker than the other wires 131a, and thus the uppermost wires may less likely be cracked during a test. Also, when only some of the wires 131a-6 overlap the test pad Pt, the stress applied to the wires 131a-6 of the sixth layer is also small, and thus the wires 131a-6 of the sixth layer may less likely be cracked during a test. Therefore, the semiconductor chip 100b of some embodiments may have a structure in which the test pad Pt and some of the uppermost wires of the multi-wiring layer 130, e.g., the wires 131a-6 of the sixth layer, overlap each other in the third direction (z direction), e.g., wherein crack formation may be prevented or reduced.

Figure 6:
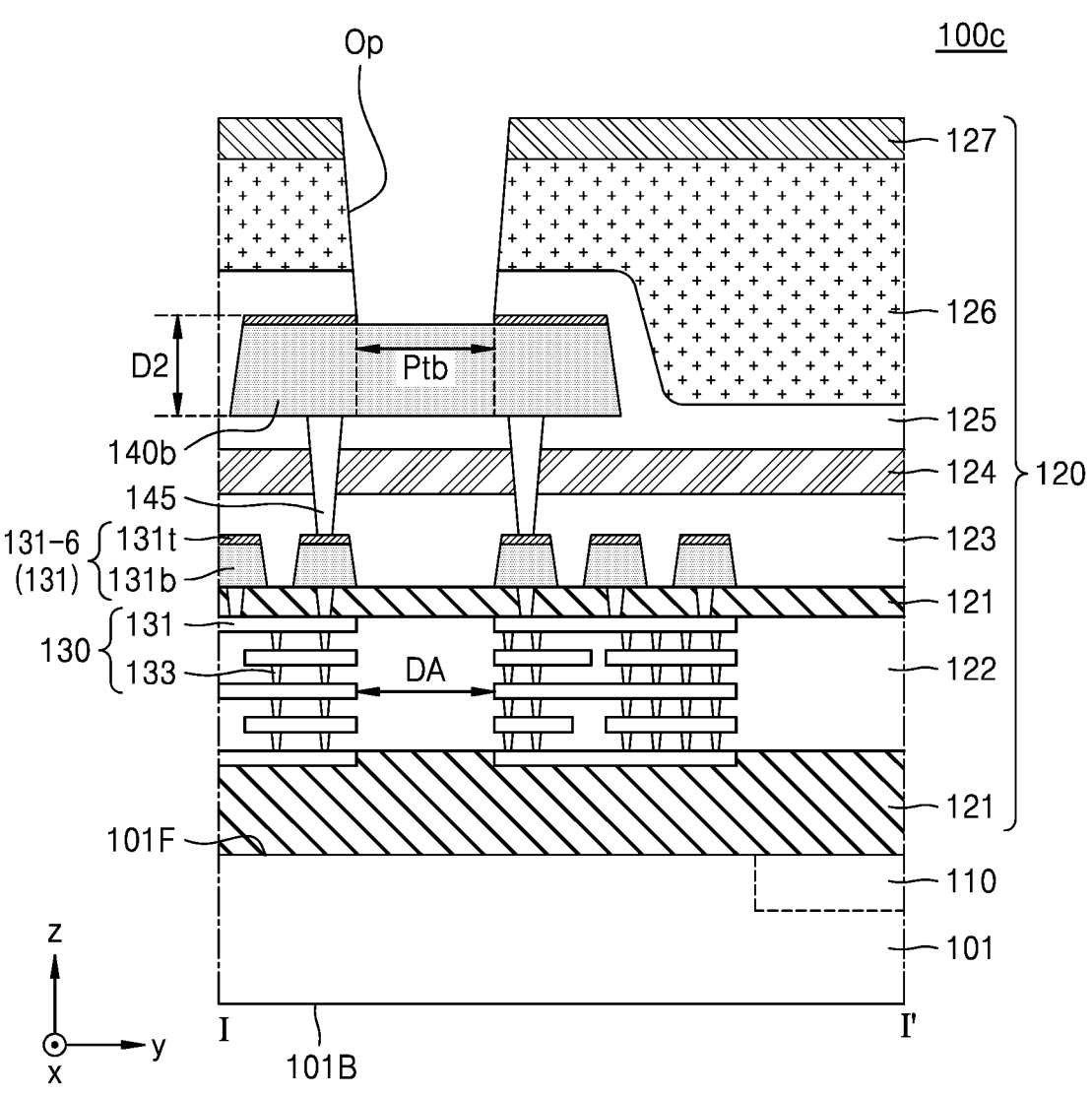
FIGS. 6 and 7 are cross-sectional views of a semiconductor chip according to some embodiments.
Figure 7:
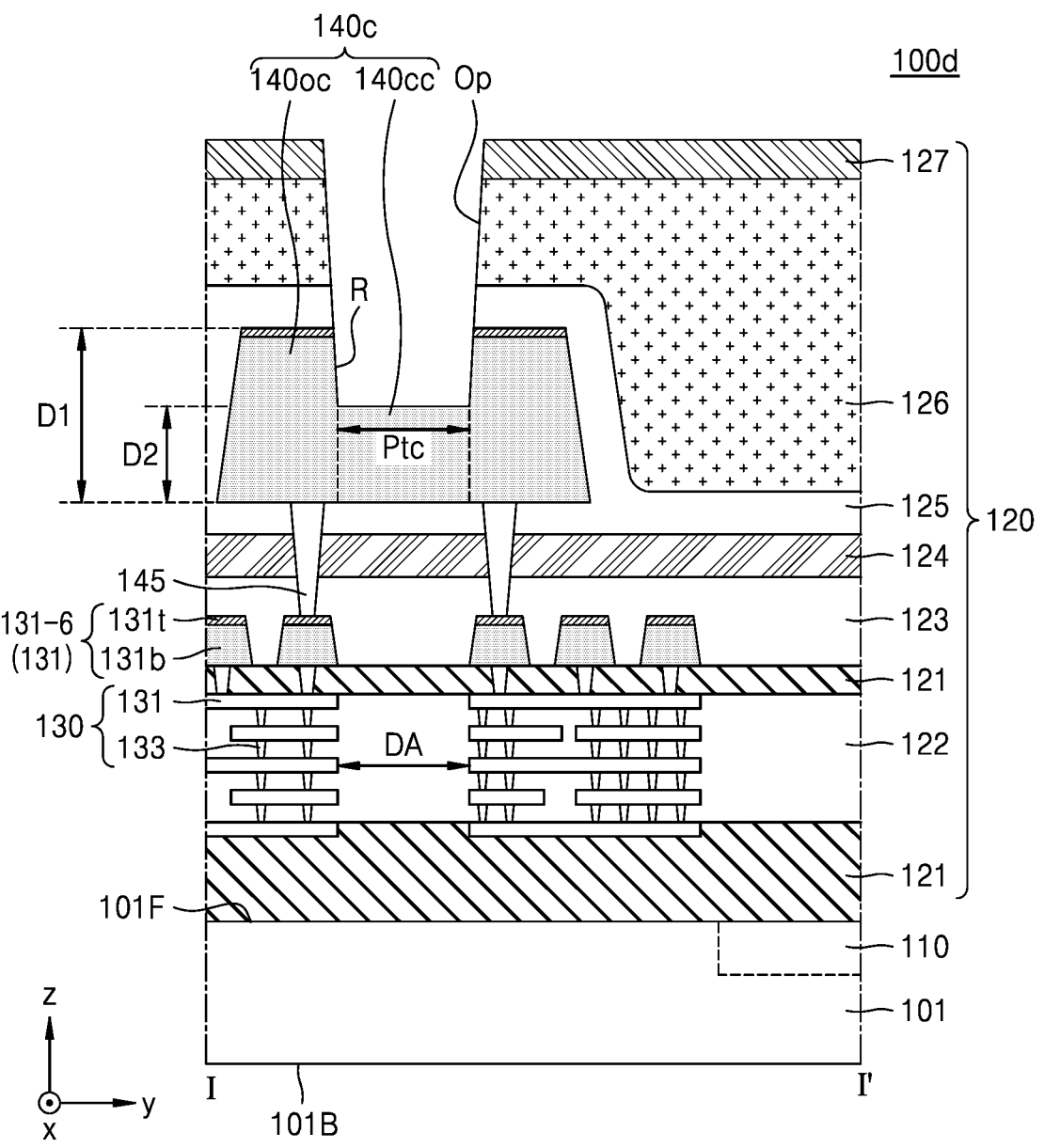
Figure 8:
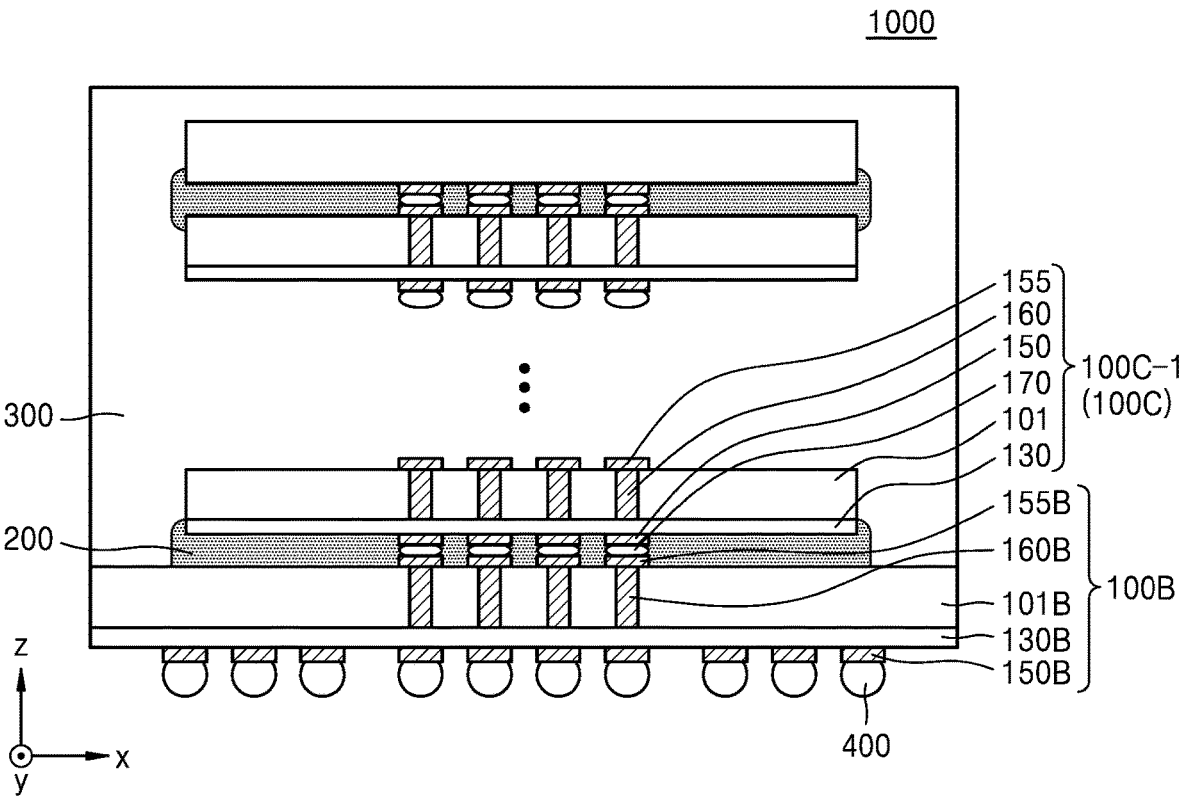
FIG. 8 is a cross-sectional view of a semiconductor package according to some embodiments.

FIGS. 6 and 7 are cross-sectional views of a semiconductor chip according to some embodiments, which may correspond to the cross-sectional view of FIG. 1C. Descriptions already given above with reference to FIGS. 1A to 4B are briefly given or omitted.

Referring to FIG. 6, a semiconductor chip 100c of some embodiments may be different from the semiconductor chip 100 of FIG. 1C in the structure of a pad metal layer 140b. In detail, in the semiconductor chip 100c according to some embodiments, the pad metal layer 140b may have a substantially uniform second thickness D2 in the third direction (z direction). The second thickness D2 may have a thickness of, for example, 1.5 μm or less. In detail, the second thickness D2 may have a thickness from about 1 μm to about 1.5 m, for example. However, the second thickness D2 of the pad metal layer 140b is not limited to the above numerical range. Since the central portion of the pad metal layer 140b corresponds to a test pad Ptb, the test pad Ptb may also have the second thickness D2.

In the case of the semiconductor chip 100c according to some embodiments, the thickness of the pad metal layer 140b may be reduced by 25% to 50% as compared to the semiconductor chip 100 of FIG. 1C. Therefore, the thickness of the semiconductor chip 100c may be reduced as much as the reduced thickness of the pad metal layer 140b, and the total thickness of a semiconductor package having a structure in which a plurality of semiconductor chips 100c are stacked may be significantly reduced.

Referring to FIG. 7, a semiconductor chip 100d of some embodiments may be different from the semiconductor chip 100 of FIG. 1C in that a pad metal layer 140c has a recessed shape. In detail, in the semiconductor chip 100d of some embodiments, a recess R may be formed in a central portion 140cc of the pad metal layer 140c. Therefore, the pad metal layer 140c may have a shape in which the central portion 140cc is thin and an outer portion 140oc is thick in the third direction (z direction). In detail, the central portion 140cc of the pad metal layer 140c, that is, a portion corresponding to a test pad Ptc, may have the second thickness D2 in the third direction (z direction), and the outer portion 140oc of the pad metal layer 140c may have the first thickness D1 in the third direction (z direction). The first thickness D1 may be, for example, 2 μm or greater, and the second thickness D2 may be, for example, 1.5 μm or less or may be from about 1 μm to about 1.5 m. However, the first thickness D1 and the second thickness D2 are not limited to the above numerical ranges.

In the semiconductor chip 100d of some embodiments, since the wires 131 of the multi-wiring layer 130 overlapping the lower portion of the test pad Ptc are omitted, the pad metal layer 140c may have various shapes. For example, in the semiconductor chip 100d of some embodiments, the recess R may be formed in the central portion 140cc of the pad metal layer 140c. Meanwhile, according to other embodiments, a pad metal layer may have a structure in which a central portion is thick and an outer portion is thin.

FIG. 8 is a cross-sectional view of a semiconductor package according to some embodiments. Descriptions of FIG. 8 are given below with reference to FIG. 1C, and descriptions already given above with reference to FIGS. 1A to 7 are briefly given or omitted.

Referring to FIG. 8, a semiconductor package 1000 according to some embodiments may include a buffer chip 100B, core chips 100C, and a sealing material 300. The buffer chip 100B may be disposed at the bottom of the semiconductor package 1000. The buffer chip 100B may have a larger size than the core chips 100C arranged above the buffer chip 100B. However, the size of the buffer chip 100B is not limited thereto. For example, the buffer chip 100B may have substantially the same size as the core chips 100C.

The buffer chip 100B may include a semiconductor substrate 101B, a wiring layer 130B, through electrodes 160B, lower electrode pads 150B, and upper electrode pads 155B. The semiconductor substrate 101B may be a silicon substrate. However, the semiconductor substrate 101B is not limited to a silicon substrate. For example, the semiconductor substrate 101B may include another semiconductor element like germanium (Ge) or a compound semiconductor like silicon carbide (SiC), gallium arsenide (GaAs), indium arsenide (InAs), or indium phosphide (InP).

Meanwhile, the semiconductor substrate 101B may include an integrated device layer therein. The integrated device layer may include a plurality of logic devices. Therefore, the buffer chip 100B may be referred to as a logic chip or a control chip. The buffer chip 100B is disposed under the core chips 100C, integrates signals of the core chips 100C and transmits them to the outside, and may also transmit signals and power from the outside to the core chips 100C. According to some embodiments, the buffer chip 100B may include a buffer memory device and a general memory device.

The wiring layer 130B is disposed under the semiconductor substrate 101B, and may include multi-layered wires therein. The wiring layer 130B may correspond to the structure including the interlayer insulation layer 120 and the multi-wiring layer 130 of the semiconductor chip 100 of FIG. 1C.

The through electrodes 160B may be arranged to penetrate through the semiconductor substrate 101B. Meanwhile, as the semiconductor substrate 101B includes silicon, the through electrodes 160B may be referred to as TSVs. In detail, in the semiconductor package 1000 of some embodiments, a through electrode 160B may have a via-middle structure. However, the inventive concept is not limited thereto, and the through electrode 160B may have a via-first structure or a via-last structure. Here, the via-first structure may refer to a structure in which a through electrode is formed before an integrated device layer is formed, the via-middle structure may refer to a structure in which a through electrode is formed after an integrated device layer is formed and before a wiring layer is formed, and the via-last structure may refer to a structure in which a through electrode is formed after a wiring layer is formed. In the semiconductor package 1000 of some embodiments, due to the via-middle structure, the through electrode 160B may penetrate through the semiconductor substrate 101B including an integrated device layer and extend to the wiring layer 130B.

The bottom surface of the through electrode 160B may be connected to a lower electrode pad 150B, and the top surface of the through electrode 160B may be connected to an upper electrode pad 155B. As shown in FIG. 8, the bottom surface of the through electrode 160B may be connected to the lower electrode pad 150B through the wiring layer 130B. On the other hand, the top surface of the through electrode 160B may be directly connected to the upper electrode pad 155B. Although not shown, a protective layer may be formed on the top surface of the semiconductor substrate 101B and the bottom surface of the wiring layer 130B, and the lower electrode pad 150B and the upper electrode pad 155B may be exposed from the protective layer. A connection terminal 400 may be disposed on the lower electrode pad 150B, and a bump 170 of the core chip 100C may be disposed on the upper electrode pad 155B.

The connection terminal 400 may be connected to the through electrode 160B through the lower electrode pad 150B and the wiring layer 130B. The connection terminal 400 may include a conductive material, e.g., copper (Cu), aluminum (Al), silver (Ag), tin (Tin), gold (Au), solder, etc. However, the material constituting the connection terminal 400 is not limited thereto. Meanwhile, the connection terminal 400 may be formed to include layers or a single layer. For example, when the connection terminal 400 is formed to include layers, the connection terminal 400 may include a copper pillar and a solder. When the connection terminal 400 is formed to include a single layer, the connection terminal 400 may include tin-silver solder or copper.

The core chip 100C may be stacked on the buffer chip 100B or another core chip 100C below through the bump 170 and an adhesive layer 200. The core chip 100C may be a concept relative to the buffer chip 100B. The core chip 100C may include a plurality of memory devices in an integrated device layer. For example, the memory devices may include volatile memory devices like DRAM and SRAM or non-volatile memory devices like PRAM, MRAM, FeRAM, or RRAM. Therefore, the core chip 100C may be a memory chip.

In the semiconductor package 1000 of some embodiments, the core chip 100C may be the semiconductor chip 100 of FIG. 1C. Therefore, in the core chip 100C, the wires 131 of the multi-wiring layer 130 may not be arranged under the central portion 140c of the pad metal layer 140, that is, under the test pads Pt. In other words, the wires 131 may not be arranged in the isolation region DA of the multi-wiring layer 130 overlapping the test pads Pt of the pad metal layer 140. Meanwhile, in the semiconductor package 1000 of some embodiments, any one of semiconductor chips 100a to 100d of FIGS. 5A to 7 may be disposed as the core chip 100C instead of the semiconductor chip 100 of FIG. 1C.

The core chip 100C may include the semiconductor substrate 101, a wiring layer 130, a lower electrode pad 150, an upper electrode pad 155, a through electrode 160, and the bump 170. The semiconductor substrate 101 may correspond to the semiconductor substrate 101 of the semiconductor chip 100 of FIG. 1C and may include the integrated device layer 110. Also, the wiring layer 130 may include the interlayer insulation layer 120 and the multi-wiring layer 130 of the semiconductor chip 100 of FIG. 1C. The through electrode 160 is the same as the through electrode 160B of the buffer chip 100B described above. Such through electrodes 160 may be arranged in a plurality of columns in the first direction (x direction) or the second direction (y direction) at the central portion of the core chip 100C.

The lower electrode pad 150 and the upper electrode pad 155 are the same as the lower electrode pad 150B and the upper electrode pad 155B of the buffer chip 100B described above. Since the bump 170 is disposed on the lower electrode pad 150, the lower electrode pad 150 may correspond to the bump pad in the semiconductor chip 100 of FIG. 1C. Therefore, lower electrode pads 150 may be arranged in the bump pad area BPA. Furthermore, the through electrodes 160 may also be arranged in the bump pad area BPA.

In the semiconductor package 1000 of some embodiments, eight core chips 100C may be stacked on the buffer chip 100B. However, the number of core chips 100C stacked on the buffer chip 100B is not limited to eight. For example, 1 to 7 core chips 100C or 9 or more core chips 100C may be stacked on the buffer chip 100B.

In the semiconductor package 1000 of some embodiments, the core chip 100C may be an high bandwidth memory (HBM) chip including DRAM devices. Therefore, the semiconductor package 1000 of some embodiments may be an HBM package. Such an HBM package may be manufactured by stacking individual DRAM chips corresponding to respective buffer chips 100B in a wafer state, that is, the core chips 100C, sealing them with the sealing material 300, and then individualizing them through a sawing process.

The sealing material 300 may cover or overlap and seal the core chips 100C on the buffer chip 100B and the adhesive layer 200. The sealing material 300 may seal the core chips 100C to protect the core chips 100C from external physical and chemical damage. The sealing material 300 may include, for example, epoxy molding compound (EMC). However, the sealing material 300 is not limited to EMC and may include various materials, e.g., an epoxy-based material, a thermosetting material, a thermoplastic material, a UV curable material, etc. Also, the sealing material 300 may include a resin and may contain a filler. As shown in FIG. 8, the sealing material 300 may cover or overlap the top surface of the uppermost core chip 100C. However, the inventive concept is not limited thereto, and the sealing material 300 may not cover or may not overlap the top surface of the uppermost core chip 100C. That is, the top surface of the uppermost core chip 100C may be exposed from the sealing material 300.

Figure 9A:
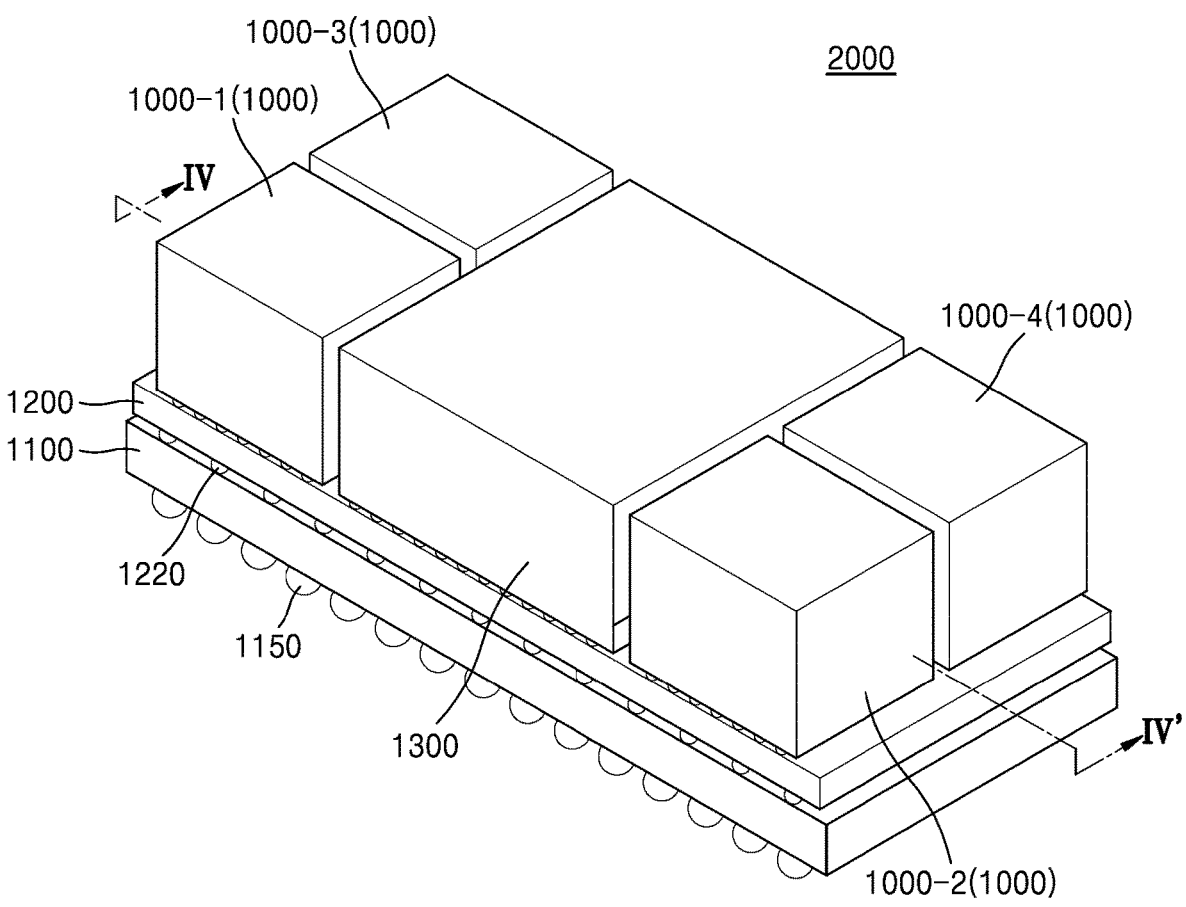
FIGS. 9A and 9B are respectively a perspective view and a cross-sectional view of a system package including a semiconductor package according to some embodiments.
Figure 9B:
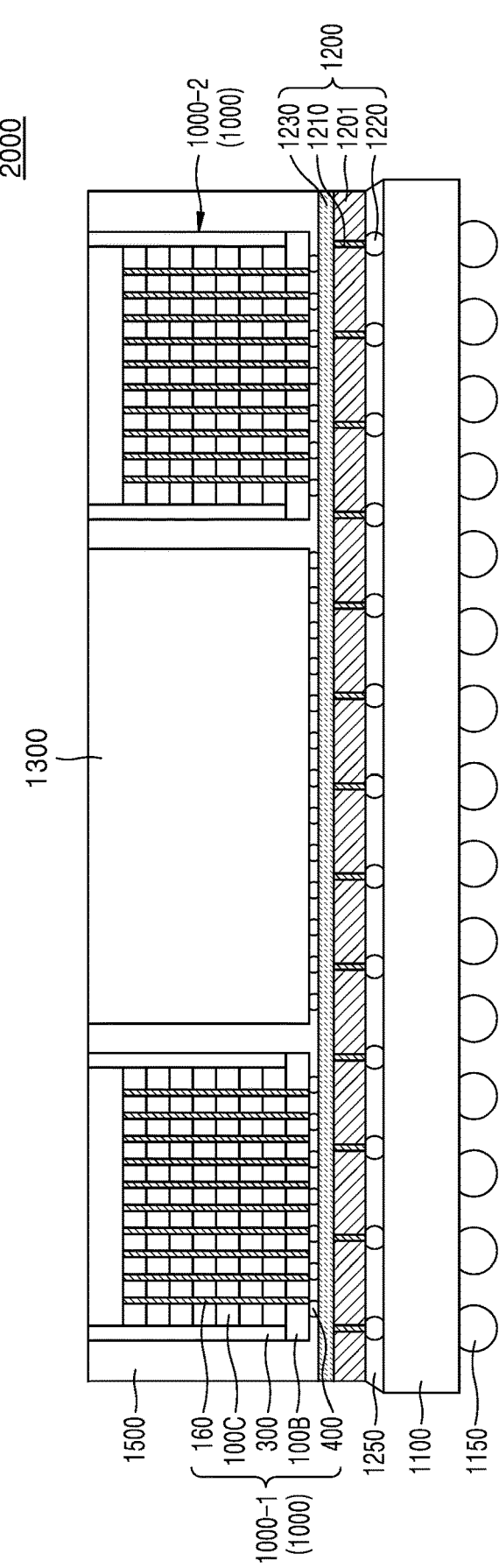

FIGS. 9A and 9B are respectively a perspective view and a cross-sectional view of a system package including a semiconductor package according to some embodiments, wherein an outer sealing material is omitted in FIG. 9A. Descriptions of FIGS. 9A and 9B are given below with reference to FIG. 8, and descriptions already given above with reference to FIGS. 1A to 8 are briefly given or omitted.

Referring to FIGS. 9A and 9B, a system package 2000 including a semiconductor package of some embodiments (hereinafter, simply referred to as a 'system package') may include the semiconductor package 1000, the package substrate 1100, a silicon (Si) interposer 1200, a first semiconductor chip 1300, and an external sealing material 1500.

The semiconductor package 1000 may include first to fourth semiconductor packages 1000-1 to 1000-4 as shown in FIG. 9A. Two of the first to fourth semiconductor packages 1000-1 to 1000-4 may be disposed on the Si interposer 1200 on each side of the first semiconductor chip 1300. However, in the system package 2000 of some embodiments, the number of semiconductor packages 1000 is not limited to four. For example, one to three semiconductor packages 1000 or five or more semiconductor packages 1000 may be arranged on the Si interposer 1200.

The semiconductor package 1000 may be, for example, the semiconductor package 1000 of FIG. 8. Therefore, the semiconductor package 1000 may be, for example, an HBM package. In detail, the semiconductor package 1000 may include the buffer chip 100B and the plurality of core chips

100C on the buffer chip 100B, and the buffer chip 100B and the core chips 100C may include through electrodes 160 and 160B therein. The buffer chip 100B and the core chips 100C are the same as those described above in the description of the semiconductor package 1000 of FIG. 8.

Although not shown in FIG. 9B, bumps 170 and adhesive layers 200 may be arranged between the buffer chip 100B and the core chip 100C and between the core chips 100C adjacent to each other. Also, as shown in FIG. 9B, the uppermost core chip 100C from among the core chips 100C may not include the through electrode 160.

The semiconductor package 1000 may be stacked on the Si interposer 1200 through connection terminals 400 on the bottom surface of the buffer chip 100B. The core chips 100C on the buffer chip 100B may be sealed by an inner sealing material 300. However, as shown in FIG. 9B, the top surface of the uppermost core chip 100C from among the core chips 100C may not be covered or overlapped by the inner sealing material 300. However, according to other embodiments, the top surface of the uppermost core chip 100C may be covered or overlapped by the inner sealing material 300. The inner sealing material 300 may correspond to the sealing material 300 in the semiconductor package 1000 of FIG. 8.

The package substrate 1100 is a support substrate on which the Si interposer 1200, the semiconductor package 1000, and the first semiconductor chip 1300 are mounted and may include at least one layer of wires therein. When wires are formed in multiple layers, wires of different layers may be connected to each other through vertical contacts. The package substrate 1100 may include, for example, a ceramic substrate, a printed circuit board (PCB), an organic substrate, an interposer substrate, etc. External connection terminals 1150 like bumps or solder balls may be arranged on the bottom surface of the package substrate 1100. The external connection terminals 1150 may function to mount the system package 2000 on an external system substrate or a main board.

The Si interposer 1200 may include a substrate 1201, through electrodes 1210, connection terminals 1220, and a wiring layer 1230. The first semiconductor chip 1300 and the semiconductor package 1000 may be stacked on the package substrate 1100 via the Si interposer 1200. The Si interposer 1200 may electrically connect the first semiconductor chip 1300 and the semiconductor package 1000 to the package substrate 1100.

The substrate 1201 of the Si interposer 1200 may include, for example, a silicon substrate. The through electrodes 1210 may extend through the substrate 1201. Since the substrate 1201 is based on a silicon substrate, the through electrodes 1210 may correspond to TSVs. The through electrodes 1210 may extend to the wiring layer 1230 and may be electrically connected to wires of the wiring layer 1230. According to embodiments, the Si interposer 1200 may include only a wiring layer therein and may not include through electrodes. The wiring layer 1230 may be disposed on the top surface or the bottom surface of the substrate 1201. For example, the positional relationship between the wiring layer 1230 and the through electrode 1210 may be relative. Upper pads of the Si interposer 1200 may be connected to the through electrodes 1210 through the wiring layer 1230.

The connection terminals 1220 may be arranged on the bottom surface of the Si interposer 1200 and may be electrically connected to the through electrodes 1210. The Si interposer 1200 may be stacked on the package substrate 1100 through the connection terminals 1220 and an underfill 1250. The connection terminals 1220 may be connected to the upper pads of the Si interposer 1200 through the through electrodes 1210 and the wires of the wiring layer 1230. Here, from among the upper pads of the Si interposer 1200, upper pads used for power or ground may be integrated and connected together to the connection terminals 1220. Therefore, the number of connection terminals 1220 may be less than the number of upper pads of the Si interposer 1200.

In the system package 2000 of some embodiments, the Si interposer 1200 may be used for converting or transmitting electrical signals between the first semiconductor chip 1300 and the semiconductor package 1000. Therefore, the Si interposer 1200 may not include devices like active devices or passive devices. Meanwhile, the space between the Si interposer 1200 and the package substrate 1100 and the space between the connection terminals 1220 may be filled with the underfill 1250. According to other embodiments, the underfill 1250 may be replaced with an adhesive layer like an adhesive film. Also, when a molded underfill (MUF) process is performed on the package substrate 1100, the underfill 1250 may be omitted.

The first semiconductor chip 1300 may be disposed at the central portion of the Si interposer 1200. The first semiconductor chip 1300 may be a logic chip. Therefore, the first semiconductor chip 1300 may include a plurality of logic devices therein. The logic devices may include, for example, AND devices, NAND devices, OR devices, NOR devices, XOR devices, XNOR devices, INV devices, ADD devices, DLY devices, FIL devices, MXT/MXIT devices, OAI devices, AO devices, AOI devices, D flip-flop devices, reset flip-flop devices, master-slaver flip-flop devices, latch devices, counter, or buffer devices. The logic devices may perform various signal processing like analog signal processing, analog-to-digital conversion, and controlling operations. The first semiconductor chip 1300 may also be referred to as a GPU chip, a CPU chip, a system-on-glass (SOG) chip, an MPU chip, an AP chip, or a control chip according to functions thereof.

The external sealing material 1500 may cover or overlap and seal the first semiconductor chip 1300 and the semiconductor package 1000 on the Si interposer 1200. As shown in FIG. 9B, the external sealing material 1500 may not cover or may not overlap the top surfaces of the first semiconductor chip 1300 and the semiconductor package 1000. However, according to other embodiments, the external sealing material 1500 may cover or overlap the top surface of at least one of the first semiconductor chip 1300 and the semiconductor package 1000. Although not shown, the system package 2000 according to some embodiments may further include a second external sealing material for covering or overlapping and sealing the Si interposer 1200 and the external sealing material 1500 on the package substrate 1100.

For reference, the structure of the system package 2000 as provided in some embodiments is referred to a 2.5D package structure, wherein the 2.5D package structure may be a relative concept to a 3D package structure in which all semiconductor chips are stacked together and there is no Si interposer. Both the 2.5D package structure and the 3D package structure may be included in system-in-package (SIP) structures.

While the inventive concept has been particularly shown and described with reference to embodiments thereof, it will be understood that various changes in form and details may be made therein without departing from the spirit and scope of the following claims.

What is claimed is:

1. A semiconductor chip comprising:
a semiconductor substrate;
an integrated device layer on the semiconductor substrate, wherein integrated devices are in the integrated device layer;
a multi-wiring layer on the integrated device layer and having at least two layers of wires; and
a pad metal layer on the multi-wiring layer, electrically connected to the wires of the multi-wiring layer, and has test pads therein,
wherein the pad metal layer extends in a first direction parallel to a top surface of the semiconductor substrate or in a second direction perpendicular to the first direction,
wherein a test pad of the test pads comprises a central portion of the pad metal layer and is exposed by a protective layer that overlaps the pad metal layer,
wherein an outer portion of the pad metal layer excluding the test pad overlaps the wires in a third direction perpendicular to the top surface of the semiconductor substrate;
wherein the multi-wiring layer comprises an isolation region that overlaps the test pad in the third direction,
wherein the wires are not in the isolation region of the multi-wiring layer;
wherein bump pads are on a central portion of a top surface of the semiconductor chip, and
wherein the test pads are on an outer portion of the top surface of the semiconductor chip.

2. The semiconductor chip of claim 1, wherein the pad metal layer is electrically connected to an uppermost wire of the multi-wiring layer through at least two via contacts, and
wherein the at least two via contacts are on the outer portion of the pad metal layer.

3. The semiconductor chip of claim 1, wherein the pad metal layer has a first shape having a substantially uniform thickness in the first direction and the second direction, or the pad metal layer has a second shape in which the central portion of the pad metal layer corresponding to the test pad is recessed.

4. The semiconductor chip of claim 3, wherein the pad metal layer has the first shape, and
wherein the pad metal layer has a thickness of 1.5 μm or less.

5. The semiconductor chip of claim 3, wherein the pad metal layer has the second shape,
wherein the test pad has a thickness of 1.5 μm or less, and
wherein the outer portion of the pad metal layer has a thickness of 2 μm or greater.

6. The semiconductor chip of claim 1, wherein the semiconductor chip comprises a dynamic random-access memory (DRAM) chip, and
wherein the integrated device layer comprises DRAM devices and through electrodes.

7. A semiconductor package comprising:
a first semiconductor chip; and
at least one second semiconductor chip stacked on the first semiconductor chip,
wherein the at least one second semiconductor chip comprises a semiconductor chip of claim 1.

8. The semiconductor package of claim 7, wherein the at least one second semiconductor chip is a high bandwidth memory (HBM) package,
wherein the first semiconductor chip comprises a buffer chip, and

wherein the at least one second semiconductor chip
comprises a DRAM chip and comprises a plurality of
second semiconductor chips.

* * * * *